United States Patent [19]
Wong et al.

[11] Patent Number: 6,121,065
[45] Date of Patent: Sep. 19, 2000

[54] WAFER SCALE BURN-IN TESTING

[75] Inventors: Chee Cheong Wong; Shun Shen Peter Wang, both of Singapore, Singapore

[73] Assignee: Institute of Microelectronics, Singapore, Singapore

[21] Appl. No.: 09/160,751

[22] Filed: Sep. 25, 1998

[30] Foreign Application Priority Data

Sep. 26, 1997 [SG] Singapore .......................... 9703575-2

[51] Int. Cl.[7] .......................... G01R 31/26; H01L 21/66
[52] U.S. Cl. ................................. 438/17; 324/765
[58] Field of Search .................. 438/14, 15, 17, 438/18; 324/763, 765

[56] References Cited

U.S. PATENT DOCUMENTS 5,047,711  9/1991   Smith et al. .
5,241,266  8/1993   Ahmad et al. .
5,389,556  2/1995   Rostoker et al. .
5,461,328  10/1995  Devereaux et al. .
5,489,538  2/1996   Rostoker et al. .
5,504,369  4/1996   Dasse et al. .
5,532,174  7/1996   Corrigan .
5,608,335  3/1997   Tailliet .
5,654,588  8/1997   Dasse et al. .
5,817,540  10/1998  Wark .................................. 438/107

*Primary Examiner*—John F. Niebling
*Assistant Examiner*—John Murphy
*Attorney, Agent, or Firm*—Proskauer Rose LLP

[57] ABSTRACT

A method of facilitating wafer level burn-in testing. The method may utilize a rerouting process to connect input and output connections of each chip on the wafer to a bus network. The bus network may be used to conduct wafer level burn-in testing and does not change the AC/DC operating characteristics of the chips.

24 Claims, 7 Drawing Sheets

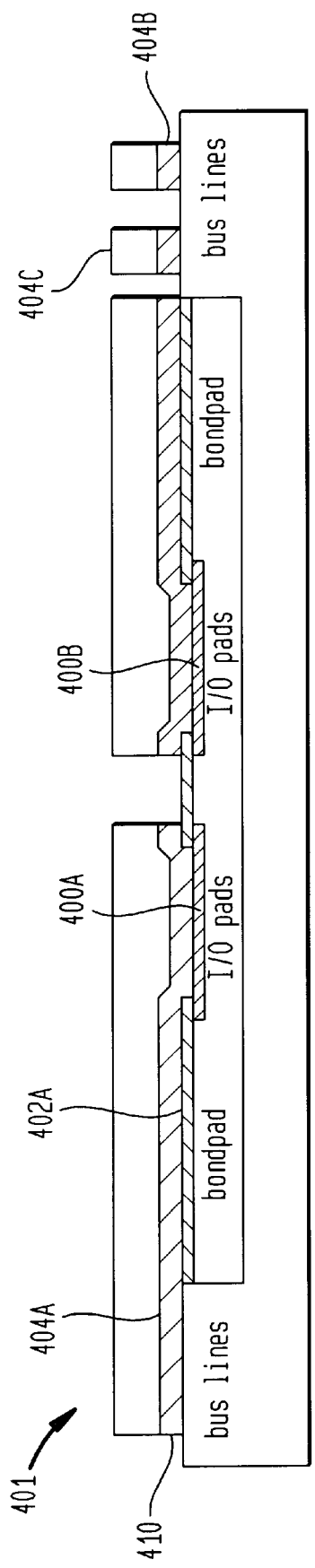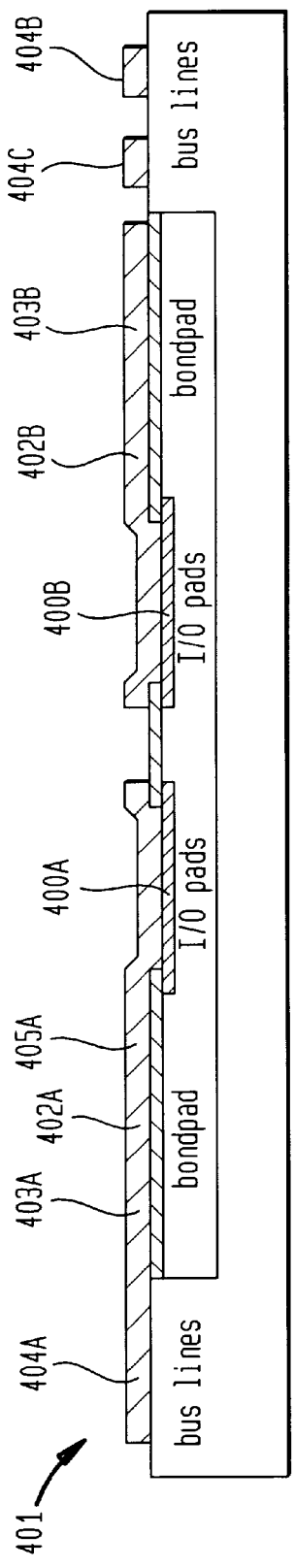
FIG. 4D
FIG. 4E

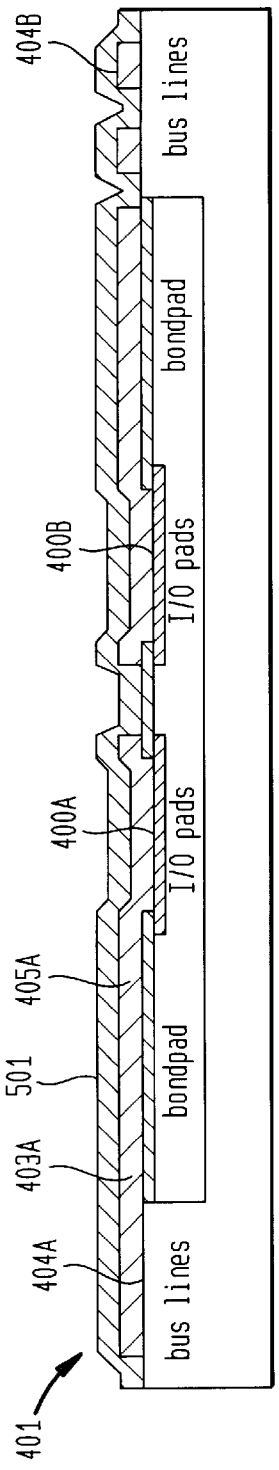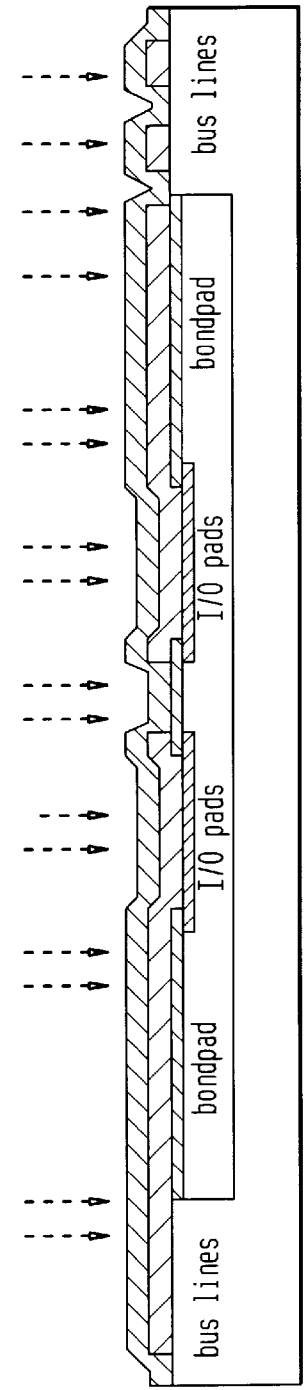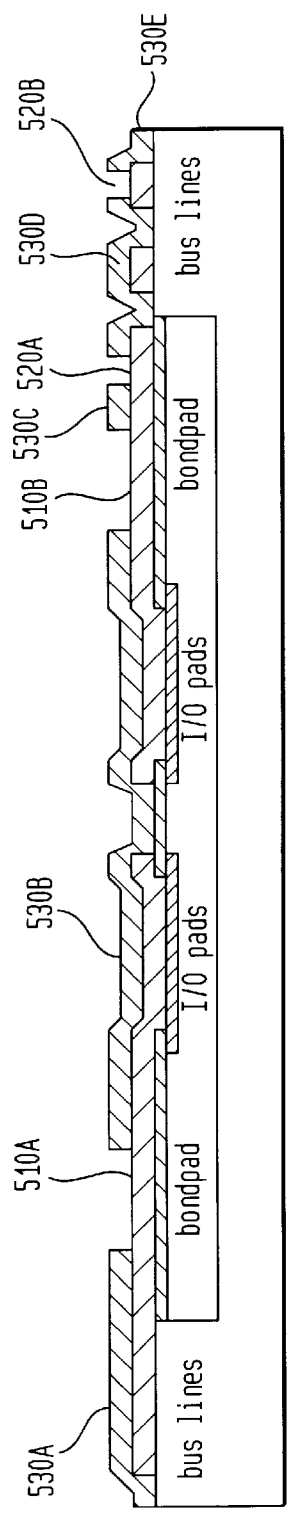

WAFER SCALE BURN-IN TESTING

FIELD OF THE INVENTION

This invention generally relates to a method of facilitating burn-in testing, and more specifically relates to a method of facilitating wafer level burn-in testing.

BACKGROUND OF THE INVENTION

Manufacturers of chips that contain integrated circuits ("ICs") may use a chip burn-in testing procedure to detect latent failures which may occur in the IC. The purpose of burn-in testing is to detect certain fabrication defects in a chip that may not be manifested outright as a chip failure. These defects may only appear sometime after the chip has power applied and the inputs and outputs ("I/Os") of the chip are exercised. Thereafter, the stress of operation may cause these defects to be manifested. These latent failures may be more difficult to isolate after the chip is integrated into a system due to inaccessibility of the I/O connections of the chip at the system level. By conducting a chip level burn-in testing procedure, these latent failures may be weeded out prior to integrating the chip into a system.

Chip burn-in testing is conducted by subjecting a chip to operating stresses, prior to integrating the chip into a system. In the case where the chip is prone to a latent failure, the stress of burn-in often times causes the latent failure to be manifested. Burn-in testing is typically conducted at temperatures in excess of 100° C. and for prolonged periods of time(e.g., 40–80 hours) with the chip running at operating voltages. In the prior art, the burn-in testing procedure may only be practically conducted on a chip that is individually packaged in one of the standard formats. In this way, the chip may be plugged into a standard burn-in testing system for burn-in testing.

Currently, it is more and more common for chips not to be packaged. For unpackaged chips, the current methods of conducting burn-in testing greatly increase the cost of producing the chip. Yet, burn-in testing is equally important for an unpackaged chip as it is for a packaged chip.

The need for burn-in testing may be readily illustrated with reference to a typical application for bare (e.g., unpackaged) chips. As an example, eight bare chips may be utilized for flip-chip assembly onto a printed circuit board ("PCB") for making a single in-line memory module ("SIMM") card. For a given wafer type and fabrication process, a dropout rate (e.g., failure rate) of 3% during burn-in may be typical.

For a case when no burn-in test is conducted, the chips will fail some time after integration into the SIMM card. For a premature failure probability of 0.03 per chip (see above), the premature failure probability of the SIMM module comprising eight chips is 0.22. This means that roughly one out of five SIMM modules will fail prematurely. This is an unacceptably high number of PCB failures for a production environment.

Burn-in testing prior to assembly (chip integration into a system) is desirable since it reduces rework (e.g., removal of bad chips) at the system level. Preferably, burn-in testing for any applications involving bare chips should be conducted prior to the chips integration into a system such as a SIMM module to reduce rework at the module level. Therefore, a practical method of detecting the burn-in failures should be conducted upstream of the production process prior to a chip's integration into a system (e.g., a SIMM module).

There are several prior art methods for conducting a bare chip burn-in procedure. In one prior art method, specialized test sockets are fabricated to house a chip for bare chip burn-in testing. The problem with this method is that it is very expensive and may result in chip costs that are two to four times the cost of the original chip. Still another prior art method of conducting bare chip testing entails placing the chip in a chip-carrier. The chip-carrier acts as a temporary packaging. The temporary packaging is configured to fit into in an existing burn-in testing system. This method is also very expensive and again may result in chip costs that are two to four times the cost of the original packaged chip.

In another prior art method, the chip may be tested prior to separation from a wafer on which the chip is fabricated. In this method, individual probes are held onto the chip I/O pads to enable burn-in testing of the chip. This method of testing a chip is not practical in a production environment since during burn-in testing, the external probes are required to be held in place for extended periods of time (e.g., 40–80 hours). Additionally, since there may typically be many individual chips on each wafer, it is a problem to position the required probes for testing all the chips on the wafer at the same time and an unacceptable period of time is required to burn-in test each chip individually.

Another problem with wafer level burn-in testing is handling all the inputs and outputs ("I/Os") required to do burn-in testing on a wafer scale. For instance, a typical eight inch memory wafer has three hundred individual chips. Each individual chip may have about thirty I/Os. For a typical burn-in procedure, only about five of the I/Os for each chip may be required. Consequently, the wafer may have a total of 1500 I/Os which may need to be driven for burn-in testing. Most prior art methods are not suitable to access all the required I/Os for wafer level burn-in testing in a production environment.

In a known-good-die test, a membrane type of supplemental wafer is aligned with, and placed on top of a wafer that is going to be tested. In this method, contacts on the supplemental wafer make contact with the I/Os of the wafer under test to enable burn-in testing. The problem with this method of testing is that the supplemental wafer is required to test the wafer under test. Consequently, for this testing process to work, a known good supplemental wafer is required to test the wafer under test. Otherwise, there is an uncertainty if a failure occurs during testing since the failure may be due to the supplemental wafer or the wafer under test.

To solve the above problems, a novel burn-in process is hereby disclosed.

Therefore, it is an object of the present invention to provide a method of conducting burn-in testing at the wafer level.

Another object of the present invention is to provide a practical method for accessing all the inputs and outputs that may be required for burn-in testing at the wafer level without requiring a supplemental wafer.

A further object of the present invention is to provide a method of wafer level burn-in testing that is cost effective.

A still further object of the present invention is to provide a method of wafer level burn-in testing that may be conducted practically in a production environment.

SUMMARY OF THE INVENTION

These and other objects of the present invention are achieved by a method of facilitating wafer level burn-in testing in accordance with the present invention. This invention pertains to a practical method of facilitating wafer level burn-in testing. A preferred method of the present invention utilizes a typical rerouting process. The rerouting process may be performed on the wafer in preparation for operations that require the I/O pads to be redistributed and/or enlarged. An example of such an operation is flip-chip assembly. In the preferred method, the rerouting process is utilized to connect the I/O's of the chips to a bus network for burn-in testing.

In an embodiment of the present inventive method, during rerouting, the contact pads that are required for burn-in testing are extended by fabricating extra leads. These extra leads extend into chip alleys ("dicing alleys") between the chips on the wafer and connect the pads to a network of bus lines. These bus lines are shared during burn-in testing by the rows and columns of chips on the wafer. Thereafter, the bus lines may be used for burn-in testing of the rows and columns of chips.

In this way, the number of pins that are required to connect to the wafer for burn-in testing may be greatly reduced. Yet, the inventive method of the present invention may not require additional fabrication processes, specialized test sockets, or temporary packaging. Additionally, the inventive burn-in testing method may not significantly increase the cost of producing the wafer. Consequently, the method of the present invention may be readily implemented in a manufacturing process.

BRIEF DESCRIPTION OF THE DRAWINGS

Following is a description of a preferred embodiment of the present invention, that when taken in conjunction with the following drawings, will demonstrate the above noted features and advantages as well as further ones. It should be expressly understood that the drawings are included for illustrative purposes and do not represent the scope of the present invention.

FIGS. 4A–4E are side cross-sectional views illustrating the first fabrication level of a rerouting process in accordance with the present invention;

FIGS. 5A–5C are side cross-sectional views illustrating the second fabrication level of a rerouting process in accordance with the present invention.

DETAILED DESCRIPTION OF THE PREFERRED EMBODIMENT

Figure 1:
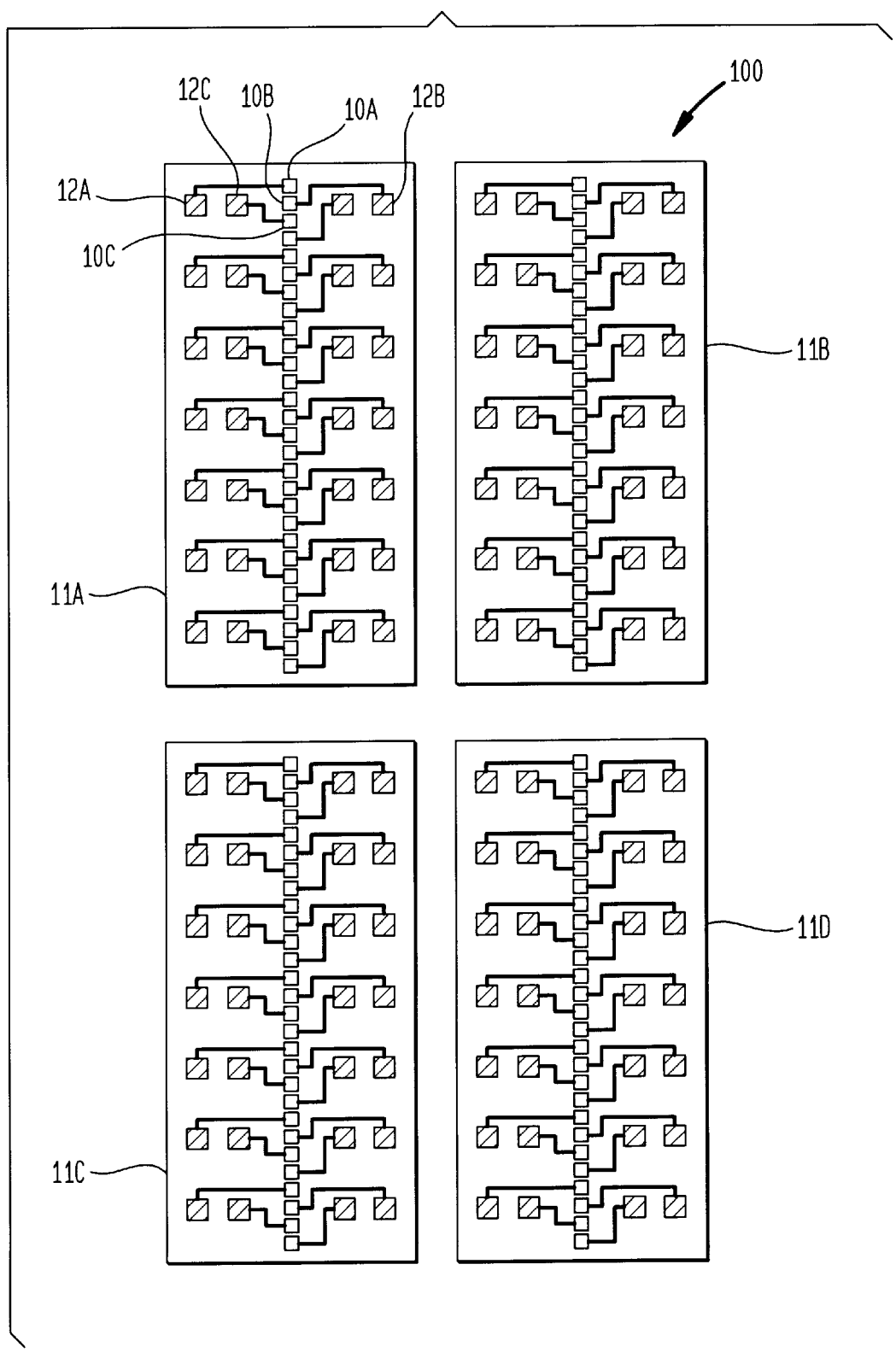
FIG. 1 is an overhead view of a typical rerouting scheme for a portion of a wafer comprised of individual chips.

FIG. 1 is an overhead view of a typical rerouting scheme for a portion of a wafer 100 having chips 11A, 11B, 11C, and 11D. Rerouting prepares a wafer for certain operations that require the I/Os of the wafer (e.g.,I/O pads) to be redistributed and/or enlarged. An example of an operation that requires rerouting is when a chip having a lead-on-chip ("LOC") layout is flip-chip assembled. For example, during rerouting, I/O pads of a chip, such as the I/O pads 10A, 10B, 10C, etc., of the chip 11A, are fanned out into an area array comprised of bond pads 12A, 12B, 12C, etc. The bond pads 12A, 12B, 12C, etc., are orientated so that they match the orientation of bond pads on a corresponding component, such as a printed circuit board ("PCB").

Rerouting is typically used in applications where components are mated together and the two components are fabricated using different fabrication technologies (e.g., silicon and PCB). Often, the different fabrication technologies may have different resolution capabilities. Consequently, the I/O pads for the two components may not mate correctly. In this case, rerouting positions the I/O pads so that the two components mate correctly. For example, rerouting is typically used when silicon chips are flip-chip bonded onto PCB substrates. The rerouting facilitates the proper orientation of the contacts (e.g., bond pads) of the chip with respect to the orientation of the bond pads of the PCB.

One prior art rerouting method comprises using one level of aluminum ("Al"), one level of a patternable insulator, such as a photo-imageable polyimide, and an under bump metallization ("UBM") layer. In this method, the Al forms the leads that reroute the I/O pads (e.g., I/O pads 10A, 10B, 10C, etc.) to an array of bond pads, such as bonds pads 12A, 12B, 12C, etc., that have a desired orientation. In this method, the bond pads may be finished with the UBM layer for subsequent integration of the chip with a mating assembly. This process may be used for instance to prepare a silicon chip for subsequent flip-chip bonding to a PCB substrate.

Figure 2:
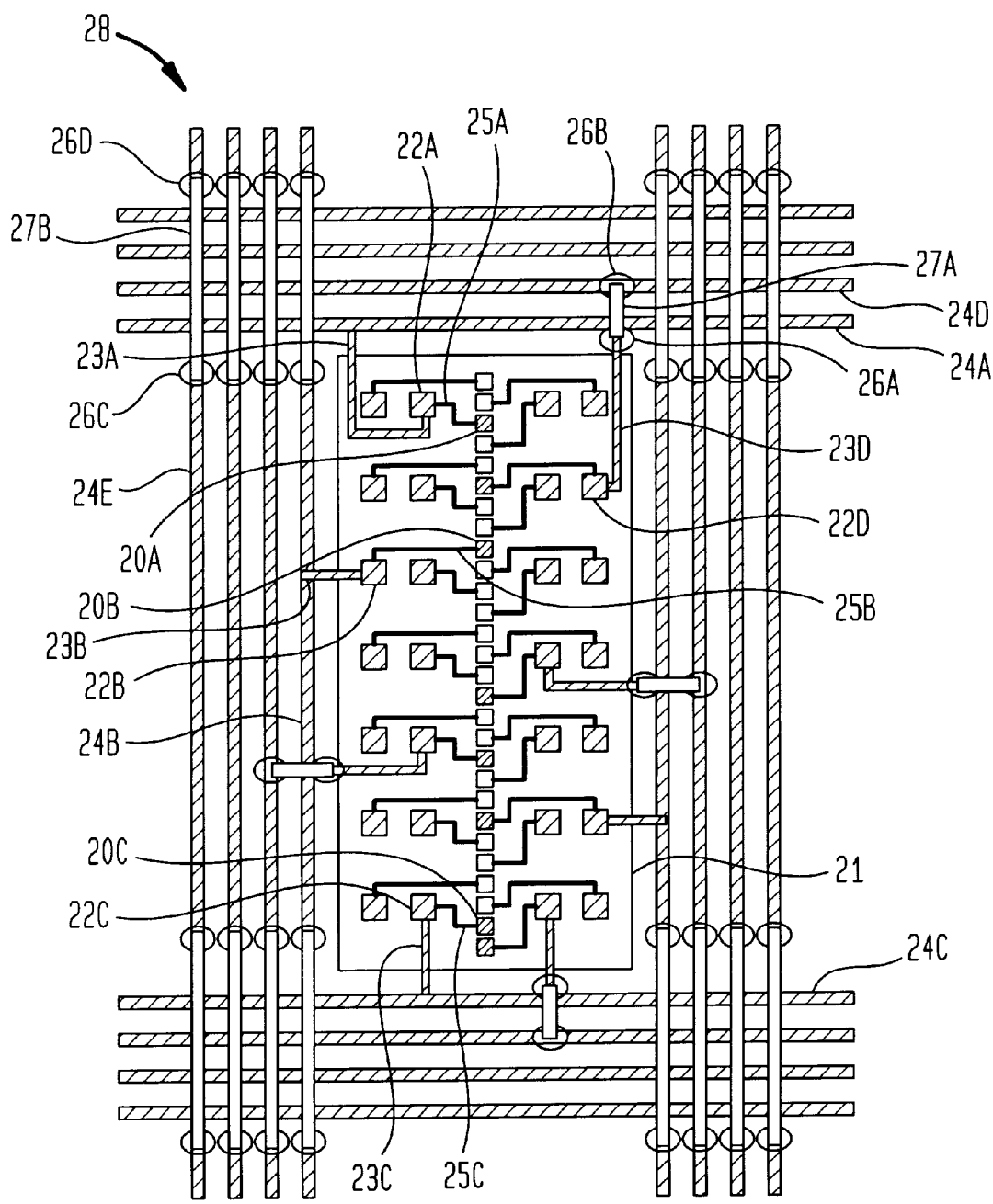
FIG. 2 is an overhead view of an embodiment of the present invention in an application with a chip that has centrally located input and output pins.

FIG. 2 is an overhead view of a portion of a wafer 28 comprised of a chip 21 having I/O pads in a center LOC layout. The wafer 28 may be comprised of many such chips. In FIG. 2, the chip 21 is shown comprising I/O pads 20A, 20B, 20C, etc. As similarly illustrated in FIG. 1, the I/O pads are shown rerouted to bond pads, such as bond pads 22A, 22B, 22C, etc., by rerouting leads 25A, 25B, 25C, etc.

FIG. 2 also shows inventive leads, such as leads 23A, 23B, 23C, etc., in accordance with an embodiment of the present invention. In the embodiment shown in FIG. 2, the leads 23A, 23B, 23C, etc., connect the bond pads 22A, 22B, 22C, etc., to individual bus lines 24A, 24B, 24C, etc., of a bus network. The bus network is formed in the dicing alleys between the chip 21 and the other chips (not shown) of the wafer 28. The re-configured chips of the wafer for burn-in testing may be fabricated on the wafer in a similar row/column structure as shown in FIG. 1.

In the inventive method of the present invention, the other chips (not shown) of the wafer are also reconfigured in a similar manner to the bus lines of the bus network for burn-in testing. In this way, wafer level burn-in may be achieved by activating entire rows/columns of chips in parallel by using the bus lines 24A, 24B, 24C, etc., of the bus network. In this inventive method, the number of leads that may be needed for a wafer level burn-in is drastically reduced by sharing the bus lines 24A, 24B, 24C, etc., among the chips of the wafer.

In accordance with an embodiment of the present invention, the total number of wafer I/O connections that may be required to access 300 chips, positioned on a wafer, for burn-in testing may be reduced from 1500 total I/O connections (e.g., the 300 chips with connections per chip required for burn-in testing) to 170 total I/O connections. The actual number of total I/O connections that may be required for burn-in testing will depend on the row and column configuration of the chips on the wafer and the number of I/O connections required per chip. In most cases, the method of the present invention will greatly reduce the total number of I/O 5 connections by using the inventive bussing structure embedded into the unused dicing alleys between the chips.

In an embodiment of the present invention, the leads 23A, 23B, 23C, etc., and the bus lines 24A, 24B, 24C, etc., may be fabricated during the same process that forms the rerouting leads 25A, 25B, 25C, etc., and the bond pads 22A, 22B, 22C, etc. As shown in FIG. 2, in some cases, a lead 23D, connecting a bond pad 22D, to a bus line 24D, may bypass a conducting portion on the wafer, such as a bus line 24A. In these cases, insulator inter-level connectors, such as connectors 26A, 26B, and a top crossover lead 27A, may be used to avoid shorting the bus line 24A to the bus line 24D. Additionally, in cases where a bus line may cross another bus line, such as bus lines 24A and 24E, a similar structure may be used, such as insulator inter-level connectors 26C and 26D and a top crossover lead 27B. In this way, the bus line 24A may cross the bus line 24E without making electrical contact.

In the present invention, the inter-level insulators (e.g., connectors 26A and 26B) may be formed during the rerouting process on the same level as the photo-imageable polyimide. The top crossover leads, such as top crossover leads 27A and 27B, may be formed using the UBM level that is applied to the bond pads (not shown) during rerouting. In a preferred embodiment, a potential problem of having exposed leads corrode over time is eliminated by only using a top lead, such as top crossover leads 27A and 27B, in the dicing alleys between the chips. When the individual chips are removed from the wafer ("diced"), these portions (e.g., the portions of the wafer between the chips) are removed. Consequently, the top leads are not left connected to the chips and therefore do not pose a corrosion risk. Further, all the input and output connections to the bus lines are also removed when the wafer is diced. Therefore, the AC/DC operating characteristics of the separated chips are not affected by the inventive rerouting process.

In the illustrative example of the present invention shown in FIG. 2, eight leads are required for burn-in testing of the chip 21. More or less leads may be required for other types of chips. Nonetheless, the method of connecting the chip I/O connections to the bus lines for enabling wafer level burn-in testing may remain the same.

Figure 3:
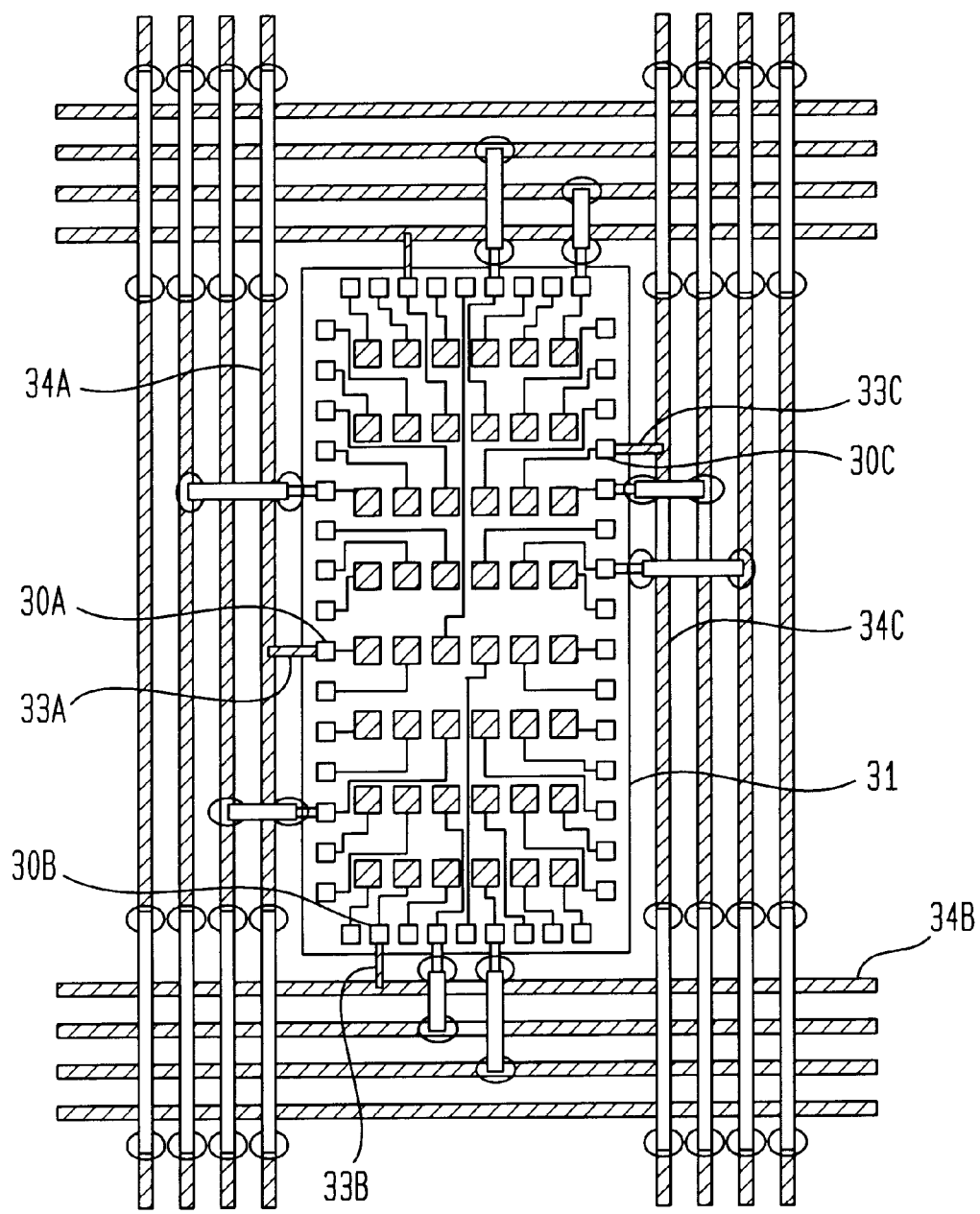
FIG. 3 is an overhead view of an embodiment of the present invention in an application with a chip that has input and output pins in a peripheral layout.

FIG. 3 shows another embodiment of the present invention wherein a chip 31 has a peripheral layout of I/O bond pads. In this embodiment, twelve leads are shown connecting the bond pads to the bus lines. Otherwise, the process of connecting the bond pads to the bus lines may be performed similarly to the process described above. In FIG. 3, the leads 33A, 33B, 33C, etc., are shown connecting I/O pads, such as I/O pads 30A, 30B, 30C, etc., to bus lines, such as bus lines 34A, 34B, 34C, etc. In FIG. 2, the leads, such as the leads 24A, 24B, 24C, etc., are shown connecting the bond pads to the bus lines. In one embodiment of the present invention, the I/O pads may be used to connect the chip to the bus lines. In another embodiment, the bond pads may be used to connect the chip to the bus lines. In still another embodiment, a mix of I/O pads and bond pads may be used to connect the chip to the bus lines.

A typical rerouting fabrication process uses three levels of fabrication. The present invention may utilize one or all three levels of a typical rerouting process to fabricate a wafer that facilitates wafer level burn-in testing.

Figure 4A:
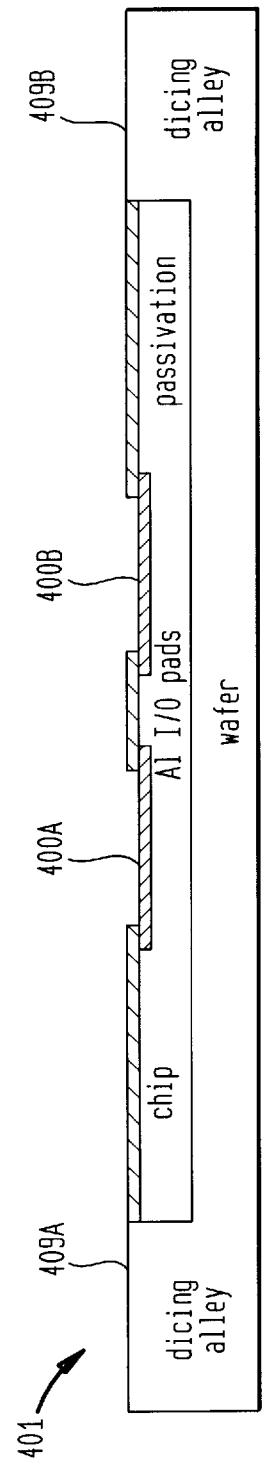

FIGS. 4A–4E are side cross-sectional views illustrating a first fabrication level of a rerouting process in accordance with the present invention. In the first fabrication level of the rerouting process, a conductive layer is deposited on a chip and thereafter, is appropriately patterned. FIG. 4A shows a chip 401, that is part of a plurality of chips (not shown) formed on a wafer (not shown). For instance, the chip 401 may have a similar orientation as shown in FIG. 1 for the wafer 100 and the chip 11A. The chip 401 has I/O pads 400A, 400B in an LOC layout. As shown, the chip is surrounded by dicing alleys 409A, 409B.

Figure 4B:
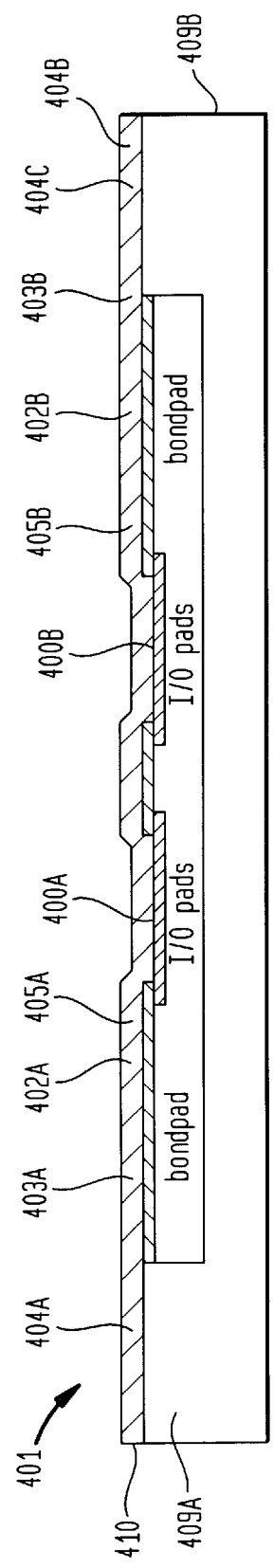

As shown in FIG. 4B, during the first fabrication level of the rerouting process, aluminum may illustratively be deposited for forming (i) leads from I/O pads to bond pads, such as leads 405A, 405B; (ii) the bond pads, such as bond pads 402A, 402B; (iii) leads from bond pads to bus lines, such as leads 403A, 403B; and (iv) the bus lines, such as bus lines 404A, 404B, 404C. Features (i) and (ii), stated above, are standard features in rerouting. Features (iii) and (iv), stated above, are features for facilitating burn-in testing in accordance with an embodiment of the present invention.

In FIG. 4B, the chip 401 is shown after coating with a conductive layer 410, that may illustratively be comprised of aluminum. The layer 410 may be deposited using a sputtering process or any other suitable deposition process. Other conductive materials, such as copper, etc., may be deposited in place of aluminum. The other conductive materials may also be deposited using a sputtering process or any other known suitable deposition process. As shown, the conductive layer 410 is illustratively in contact with the I/O pads 400A, 400B and extends into the dicing alleys 409A, 409B.

Figure 4C:
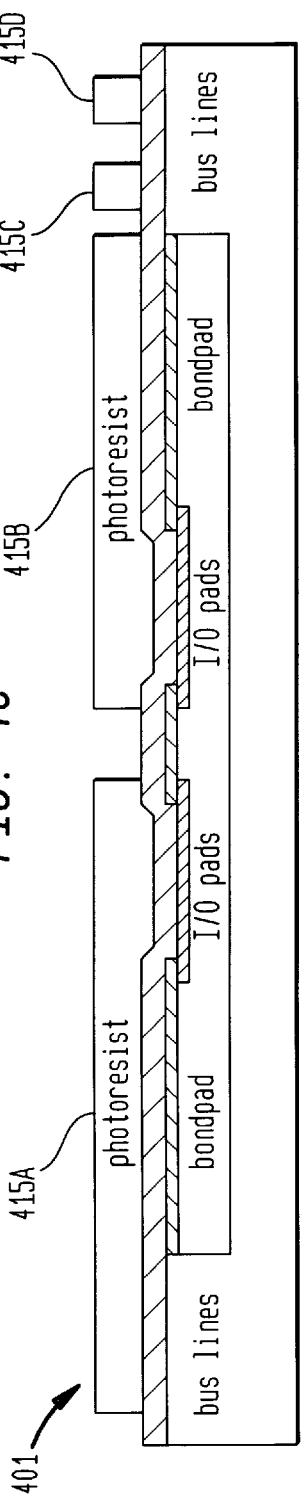

FIG. 4C illustrates the next step wherein the conductive layer 410 (e.g., aluminum) is coated with a photoresist layer comprised of photoresist portions 415A, 415B, 415C, 415D. The photoresist portions are illustratively formed by first coating the chip 401 with a photoresist layer. Next, the photoresist layer is exposed through a mask and thereafter developed to form the photoresist portions. In FIG. 4D, the conductive layer 410 is shown etched, illustratively using a wet etch process, to electrically isolate the I/O pad 400A from the I/O pad 400B, and to form electrically isolated bus lines 404B, 404C. Note that the bus line 404A is not etched since in the embodiment shown, it is desired that the bus line 404A be in electrical contact with the bond pad 402A and the I/O pad 400A.

In FIG. 4E, the resulting chip 401 is shown after the photoresist portions 415A, 415B, 415C, 415D (shown in FIG. 4D) are stripped. As shown in FIG. 4E, the lead 405A, the bond pad 402A, the bus lead 403A, and the bus line 404A form one continuous connection between the I/O pad 400A, the bond pad 402A and the bus line 404A. This type of connection is similar to the connection shown in FIG. 2 between the I/O pad 20A, the lead 25A, the bond pad 22A, the lead 23A, and the bus line 24A. In one embodiment of the present invention, only this form of continuous connection may be required for burn-in testing. Consequently, no further fabrication levels may be required.

Returning to FIG. 4E, the I/O pad 400B is connected to the bond pad 402B through the I/O bond pad lead 405B. In the illustrative embodiment, it is desired that the bond pad 402B is connected to the bus line 404B through the lead 403B, however, a crossover is required over the bus line 404C. Consequently, additional fabrication levels are required. This connection is similar to the connection shown in FIG. 2 between the bond pad 22D and the bus line 24D. For forming this desired connection, levels two and three of the rerouting process may be used to connect the bond pad 402B to the bus line 404B, as discussed in more detail below.

FIGS. 5A–5C illustrate the second fabrication level of the rerouting process. In FIG. 5A, the chip 401 is coated with a process compatible insulator to form a non-conductive layer 501, such as a photo-imageable polyimide layer. By the term process compatible, what is intended is that an insulator be selected wherein fabrication (e.g., patterning) of the process compatible insulator does not adversely affect the previous (first) level of fabrication. The layer 501 covers the leads (e.g., the leads 403A, 405A, etc.), the I/O pads (e.g., the I/O pads 400A, 400B, etc.) and the bus lines (e.g., the bus lines 404A, 404B, etc.).

It should be noted that although a photo-imageable polyimide is illustratively utilized for purposes of discussion hereinafter as the layer 501, many other processable insulators may be suitably utilized for the layer 501. For instance, there are also a broad base of non-photosensitive polyimides that may be utilized. In addition, benzocyclobutene (BCB) is another processable insulator that has similar properties to a polyimide and may be processed in a similar fashion as the polyimide.

In FIG. 5B, a portion of the layer 501, illustratively a photo-imageable polyimide layer, is patterned illustratively through a photo mask so that only selected portions of the polyimide layer are exposed. In the embodiment shown in FIG. 5B, a negative tone photo-imageable polyimide is illustratively used. For a negative tone photo-imageable polyimide, the exposed areas remain after development (e.g., a polyimide portion 530A shown in FIG. 5C). In an alternate embodiment (not shown), a positive tone photo-imageable polyimide may be used in place of the negative tone photo-imageable polyimide. For a positive tone photo-imageable polyimide, the exposed areas are removed during development. When using a positive tone photo-imageable polyimide, the photo mask should mask the portions of the photo-imageable polyimide that should remain after development (e.g., the polyimide portion 530A shown in FIG. 5C).

In FIG. 5C, the photo-imageable polyimide layer is developed and cured to form polyimide portions 530A, 530B, 530C, 530D, 530E. As discussed above, during development, portions of the polyimide layer are washed away to form polyimide vias 510A, 510B and cross over vias 520A, 520B.

Figure 6:
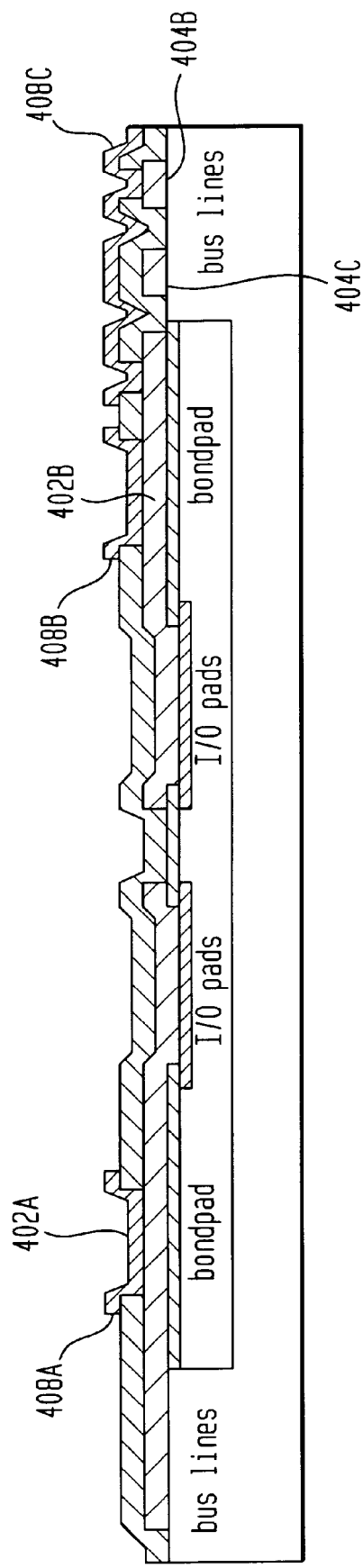
FIG. 6 is a side cross-sectional view illustrating the third fabrication level of a rerouting process in accordance with the present invention.

FIG. 6 illustratively shows the third fabrication level of the rerouting process in accordance with an embodiment of the present invention. As typical in a rerouting process, an under bump metallization layer comprised of under bump metallization portions 408A, 408B are used to prepare the surface finish of the bond pads 402A, 402B for subsequent solder bumping or solder-based assembly. In accordance with an embodiment of the present invention, an under bump metallization portion 408C forms an electrical contact between the bond pad 402B and the bus line 404B while bypassing (e.g., not making electrical contact) the bus line 404C. This type of connection between the bond pad 402B and the bus line 404B is similar to the connection shown in FIG. 2 between the bond pad 22D and the bus line 24D.

While the above described process illustratively shows a chip having an LOC layout with centrally located I/O pads, the present inventive method may also illustratively be used wherein the I/O pads are in alternate LOC layouts, such as when the I/O pads are in a peripheral layout.

In general, the inventive method of the present invention may be applicable to all chip wafers. In a preferred embodiment of the present invention, the method is applied wherein rerouting is part of the typical fabrication process for a chip, such as when a chip's I/O's are rerouted for flip-chip bonding to a PCB substrate. The layout of the I/O pads (central, perimeter, etc.) does not affect the applicability of the inventive method disclosed herein.

CONCLUSION

The wafer scale burn-in testing method of the present invention may be used to replace known-good-die and chip scale burn-in testing. A preferred embodiment of the present invention makes use of the rerouting operation, which may be used for reorienting the I/O pads on a chip surface, to connect the chip to a bus network for burn-in testing. In this embodiment, the appropriate I/O connections on a chip (e.g., the I/O connections that may be required for burn-in testing) may be rerouted to the chip dicing alleys to connect to a bus network that runs the length of the wafer. In this way, to facilitate burn-in testing, the bus network may address in parallel all the required chip I/O connections of each chip on a wafer.

The inventive method of the present invention may not require additional fabrication processes by utilizing a rerouting process that may be a part of a typical I/O pad redistribution and/or enlargement process. Therefore, the method of the present invention does not significantly affect the production cost of the chip. This makes the novel method of the present invention an attractive option for implementing wafer level burn-in testing. In addition, since the bus lines used for burn-in testing are removed when the chip is diced (e.g., removed from the wafer), the AC/DC operating characteristics of the chips are not affected.

The invention is described above with reference to preferred embodiments. It will be apparent to those skilled in the art that numerous alternative embodiments may be devised without departing from the spirit and scope of the invention which is defined by the appended claims. The preferred embodiments described above were intended to be illustrative only and were not intended to limit the scope of the appended claims.

We claim:

1. A method of fabricating a wafer that facilitates wafer level burn-in testing, said wafer having a plurality of chips formed thereon having input and output connections, said method comprising the steps of:
   (a) depositing a first conductive layer over said plurality of chips including at least one of said input and output connections for each one of said plurality of chips; and
   (b) forming a bus line, during a pad redistribution process, in electrical contact with said conductive layer, comprising the steps of:
      i. depositing an insulating layer over a conducting portion of said wafer; and
      ii. depositing a second conductive layer such that said at least one of said input and output connections for each one of said plurality of chips is in electrical contact with said bus line and is insulated from electrical contact with said conducting portion;
   wherein said bus line being suitably positioned to receive a connection for burn-in testing.

2. The method of claim 1, further comprising the steps of:
   selecting said conductive layer to extend into a dicing alley beyond said plurality of chips; and
   selecting said bus line to be formed in said dicing alley.

3. The method of claim 1, wherein said depositing of said insulating layer further comprises the steps of:
   selecting said insulating layer to be a photo-imageable polyimide;
   exposing a portion of said photo-imageable polyimide over said conducting portion of said wafer through a photo mask;

developing said photo-imageable polyimide; and curing said photo-imageable polyimide.

4. The method of claim 3, further comprising the step of selecting said photo-imageable polyimide to be a negative tone polyimide.

5. The method of claim 3, further comprising the step of selecting said photo-imageable polyimide to be a positive tone polyimide.

6. The method of claim 1, further comprising the step of selecting said insulator layer to be a benzocyclobutene (BCB) layer.

7. The method of claim 1, wherein said conductive layer is a first conductive layer and said bus line is a first one of a plurality of bus lines, said method of forming a bus line further comprising the steps of:

depositing an insulating layer over a second one of said plurality of bus lines positioned between said first one of said plurality of bus lines and said at least one of said input and output connections;

depositing a second conductive layer such that said at least one of said input and output connections is in electrical contact with said first one of said plurality of bus lines and is insulated from electrical contact with said second one of said plurality of bus lines.

8. The method of claim 7, further comprising the step of selecting said second conductive layer to be an under bump metallization (UBM) layer.

9. The method of claim 1, further comprising the step of selecting the fabrication method to be a portion of a rerouting process.

10. The method of claim 1, further comprising the step of selecting said conductive layer to be an aluminum layer.

11. The method of claim 1, further comprising the step of selecting said depositing of said conductive layer to be a sputtering deposition process.

12. The method of claim 1, wherein said method of forming a bus line further comprises the steps of:

coating a portion of said conductive layer that forms said bus line with a photoresist layer;

removing a portion of said conductive layer that is not coated with said photoresist layer; and stripping said photoresist layer.

13. The method of claim 12, wherein said method of coating a portion of said conductive layer comprises the steps of:

depositing a photoresist layer;

exposing a portion of said photoresist layer using a photoresist mask, said exposed portion being positioned over said portion of said conductive layer that forms said bus line;

developing said exposed portion of said photoresist layer; and stripping a portion of said photoresist layer that is not exposed.

14. The method of claim 12, further comprising the step of selecting said removing of said portion of said conductive layer to be a wet etch process.

15. A method of facilitating wafer level burn-in testing comprising the steps of:

(a) providing a wafer comprised of a plurality of chips, each chip comprising input and output connections for burn-in testing;

(b) fabricating a bus network during a rerouting process; and (c) fabricating leads, connecting said input and output connections of each chip of said plurality of chips to said bus network during said rerouting process, comprising the steps of:

i. fabricating a rerouting lead for the wafer;

ii. fabricating a process compatible insulator level; and iii. fabricating an under bump metallization layer for the wafer and for connecting said rerouting lead to a first bus of said bus network, wherein said insulator level is positioned such that sad rerouting lead bypasses a second bus of said bus network without said rerouting lead making electrical contact with said second bus, wherein said rerouting process comprises forming rerouting lead and bond pads.

16. The method of claim 15, further comprising the step of selecting said insulator level to be a polyimide level.

17. The method of claim 16, further comprising the step of selecting said polyimide level to be a photo-imageable polyimide level.

18. The method of claim 15, further comprising the step of selecting said insulator level to be a benzocyclobutene (BCB) level.

19. A method of facilitating wafer level burn-in testing, comprising the steps of:

(a) providing a wafer comprised of a plurality of chips, each chip comprising input and output connections for burn-in testing;

(b) fabricating a bus network during a rerouting process;

(c) fabricating leads connecting said input and output connections of each chip of said plurality of chips to said bus network during said rerouting process;

(d) selecting said bus network to be comprised of bus lines;

(e) selecting one of said leads to bypass a bus line, wherein said step of selecting said one of said leads to bypass a bus line further comprises the steps of:

i. fabricating a bottom layer;

ii. fabricating inter-level insulator connectors during the rerouting process on a same level as a photo-imageable polyimide; and iii. fabricating a top layer, wherein said bottom and top layers are in electrical contact through said inter-level insulator connectors.

20. The method of claim 19, wherein said input and output connections are located centrally on each chip of said plurality of chips, said method further comprising the steps of:

(a) selecting said input and output connections to be bond pads; and (b) selecting said rerouting process to be rerouting said bond pads to input and output pads.

21. The method of claim 20, further comprising the step of selecting said bond pads to be finished with an under bump metallization layer.

22. The method of claim 19, further comprising the step of selecting said bottom layer to be comprised of aluminum.

23. The method of claim 19, further comprising the step of selecting said top layer to include a top crossover lead, the top crossover lead formed from an under bump metallization layer.

24. The method of claim 19, further comprising the steps of:

selecting said wafer to be further comprised of chip dicing alleys; and positioning said top layer of each of said leads to be within said chip dicing alleys.

* * * * *